US010015879B2

(12) United States Patent
Hawtof et al.

(10) Patent No.: US 10,015,879 B2
(45) Date of Patent: Jul. 3, 2018

(54) SILICA CONTENT SUBSTRATE SUCH AS FOR USE HARSH ENVIRONMENT CIRCUITS AND HIGH FREQUENCY ANTENNAS

(71) Applicant: Corning Incorporated, Corning, NY (US)

(72) Inventors: Daniel Warren Hawtof, Corning, NY (US); Archit Lal, Ithaca, NY (US); Jen-Chieh Lin, Zhubei (TW); Gary Richard Trott, San Mateo, CA (US)

(73) Assignee: Corning Incorporated, Corning, NY (US)

( * ) Notice: Subject to any disclaimer, the term of this patent is extended or adjusted under 35 U.S.C. 154(b) by 42 days.

(21) Appl. No.: 15/416,663

(22) Filed: Jan. 26, 2017

(65) Prior Publication Data

US 2017/0215270 A1 Jul. 27, 2017

Related U.S. Application Data

(63) Continuation of application No. PCT/US2017/015006, filed on Jan. 26, 2017.
(Continued)

(51) Int. Cl.
H05K 1/02 (2006.01)
H01Q 9/04 (2006.01)
(Continued)

(52) U.S. Cl.
CPC ............... H05K 1/024 (2013.01); H01Q 1/12 (2013.01); H01Q 9/04 (2013.01); H05K 1/028 (2013.01);
(Continued)

(58) Field of Classification Search
CPC ...... H05K 1/024; H05K 1/0271; H05K 1/028; H05K 1/0306; H05K 1/115;
(Continued)

(56) References Cited

U.S. PATENT DOCUMENTS 3,116,137 A 12/1963 Vasilos et al.
3,301,635 A 1/1967 Bergna et al.
(Continued)

FOREIGN PATENT DOCUMENTS

EP 0728709 B1 4/1998
WO 2015005421 A1 1/2015

OTHER PUBLICATIONS

"HPFS Fused Silica Standard Grade" 2007, retrieved from: http://web.archive.org/web/20070328114712/http://corning.com/docs/specialtymaterials/pisheets/H0607_hpfs_Standard_ProductSheet.pdf.
(Continued)

Primary Examiner — Jonathan C Langman
(74) Attorney, Agent, or Firm — Russell S. Magaziner

(57) ABSTRACT

A high silica content substrate, such as for a device, is provided. The substrate has a high silica content and is thin. The substrate may include a surface with a topography or profile that facilitates bonding with a conductive metal layer, such as a metal layer for a circuit or antenna. The substrate may be flexible, have high temperature resistance, very low CTE, high strength and/or be non-reactive. The substrate may be suitable for use in circuits intended for use in high temperature environments, low temperature environments, reactive environments, or other harsh environments. The substrate may be suitable for high frequency antenna applications.

19 Claims, 6 Drawing Sheets

Related U.S. Application Data

(60) Provisional application No. 62/287,645, filed on Jan. 27, 2016.

(51) Int. Cl.
   *H01Q 1/12* (2006.01)
   *H05K 1/03* (2006.01)
   *H05K 1/11* (2006.01)

(52) U.S. Cl.
   CPC ......... *H05K 1/0271* (2013.01); *H05K 1/0306* (2013.01); *H05K 1/115* (2013.01); *H05K 2201/068* (2013.01); *H05K 2201/10098* (2013.01)

(58) Field of Classification Search
   CPC ... H05K 2201/068; H05K 2201/10098; H01Q 1/12; H01Q 9/04
   See application file for complete search history.

(56) References Cited

U.S. PATENT DOCUMENTS

| | | | |
|---|---|---|---|
| 3,837,825 | A | 9/1974 | Loxley et al. |
| 4,946,546 | A * | 8/1990 | Bourgeois-Moine ... C03C 17/06 204/192.3 |
| 9,258,892 | B2 | 2/2016 | Crosley |
| 9,296,614 | B1 * | 3/2016 | Lal .......................... B01J 35/10 |
| 2003/0116276 | A1 | 6/2003 | Weldon et al. |
| 2007/0077395 | A1 * | 4/2007 | Masai ................... B81C 1/0038 428/141 |
| 2009/0220721 | A1 | 9/2009 | Matsusaki |
| 2011/0244183 | A1 | 10/2011 | Goto et al. |
| 2013/0075146 | A1 | 3/2013 | Fushie et al. |
| 2013/0316136 | A1 | 11/2013 | Hawtof et al. |
| 2014/0070999 | A1 * | 3/2014 | Kaneda ................... H01L 24/14 343/700 MS |
| 2014/0159025 | A1 | 6/2014 | Fukuoka et al. |
| 2014/0247269 | A1 | 9/2014 | Berdy et al. |
| 2015/0132511 | A1 | 5/2015 | Scheich et al. |
| 2015/0143848 | A1 * | 5/2015 | Schenk ................... C03C 17/04 65/33.4 |
| 2016/0090319 | A1 | 3/2016 | Hofmann et al. |

OTHER PUBLICATIONS

International Search Report and Written Opinion PCT/US2017015006 dated Apr. 3, 2017.

Valley Design: "Fused Silica Sheets" 2015, retrieved from: http://www.ultra-thin.com/fused-quartz.htm.

Stygar et al.; "3D Packaging—Synthetic Quartz Substrate and Interposers for High Frequency Applications"; http://agcem.com/files/pdf/IWLPC_PAPER_HIGH_FREQUENCY.pdf; Date Accessed: Jan. 23, 2017; pp. 1-5.

Stygar et al.; "3D Packaging Synthetic Quartz Substrate and Interposer for High Frequency Applications"; International Wafer-Level Packaging Conference (Nov. 6-8, 2012); http://agcem.com/files/pdf/IWLPC_PPT_3D_Presentation.pdf; Date Accessed: Jan. 23, 2017.

* cited by examiner

US 10,015,879 B2

SILICA CONTENT SUBSTRATE SUCH AS FOR USE HARSH ENVIRONMENT CIRCUITS AND HIGH FREQUENCY ANTENNAS

This application is a continuation of International Patent Application Serial No. PCT/US17/15006, filed on Jan. 26, 2017, which claims the benefit of priority under 35 U.S.C. § 119 of U.S. Provisional Application Ser. No. 62/287,645, filed on Jan. 27, 2016, the contents of which are relied upon and incorporated herein by reference in their entireties.

BACKGROUND

The disclosure relates generally to high-silica content substrate materials, and specifically to high-silica content substrate materials for formation of circuits, printed circuit boards, antennas, etc. Silica soot may be generated by a process, such as flame hydrolysis. The silica soot may then be sintered to form a high silica content substrate.

SUMMARY

One embodiment of the disclosure relates to a device, such as an electrically conductive device and/or a high-frequency, low-loss device, and/or substrate for such a device. The device may include a substrate with high silica content, where the substrate may be a part of a laminate stack having different frequency substrates and/or metal redistribution layers or the substrate may be incorporated with a printed circuit board (PCB) and may have ground planes on the top and bottom of the substrate with a signal trace therebetween, possibly including two the substrates, for example. High electrical breakdown resistance of sintered silica in such a device could serve as insulation between two circuit board transformers.

According to an embodiment, the substrate includes a first major surface, a second major surface opposite the first major surface, at least 99.9% $SiO_2$ by weight for the substrate and an average thickness between the first major surface and the second major surface of less than 1 mm. The substrate includes a low coefficient of thermal expansion of about $10 \times 10^{-7}/°$ C. or less in a temperature range of about 50 to 300° C., facilitating dimensional stability of the substrate. The device includes a layer of metal material bonded to the first major surface of the substrate, and the layer of metal material forms a pattern on the first major surface and is configured to conduct current.

An additional embodiment of the disclosure relates to an electrically conductive device. The device includes a high silica content substrate. The substrate includes a first major surface, a second major surface opposite the first major surface, at least 99.9% $SiO_2$ by weight and an average thickness between the first major surface and the second major surface of less than 1 mm. The first major surface of the substrate includes a plurality of raised features and a plurality of recessed features, and at least some of the raised features extend from the surface a distance of at least 10 angstroms further than the recessed features. The device includes a layer of metal material supported by the first major surface, and the layer of metal material forms a pattern on the first major surface and is configured to conduct current along the pattern. The layer of metal material extends over at least one recessed feature and at least one raised feature.

An additional embodiment of the disclosure relates to a substrate for an electrically conductive device. The substrate includes a first major surface, a second major surface opposite the first major surface, at least 99.9% $SiO_2$ by weight and an average thickness between the first major surface and the second major surface of less than 1 mm. The substrate includes a low coefficient of thermal expansion less than $10 \times 10^{-7}/°$ C. in a temperature range of about 50 to 300° C., thereby facilitating dimensional stability of the substrate. The substrate includes at least one surface feature configured to receive deposition (e.g., silk screening, printed, or laminated Cu foils) of a layer of metal material and to bond the metal layer to the first major surface of the substrate such that the layer of metal material following deposition forms a pattern on the first major surface.

Additional features and advantages will be set forth in the detailed description that follows, and, in part, will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding and are incorporated in and constitute a part of this specification. The drawings illustrate one or more embodiment(s), and together with the description serve to explain principles and the operation of the various embodiments.

DETAILED DESCRIPTION

Figure 1A:
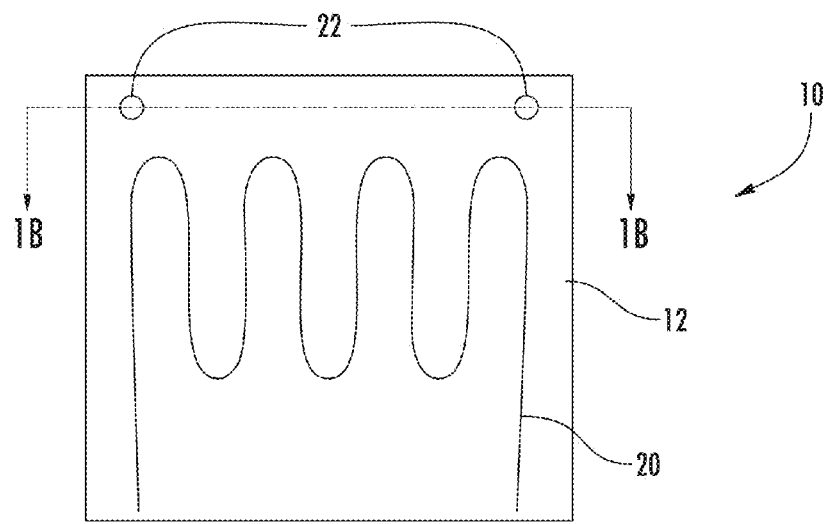
FIG. 1A shows a top view of a metallized silica substrate according to an exemplary embodiment.

Referring generally to the figures, a high silica content substrate for use in the formation of a circuit, such as a high frequency antenna, a circuit for use in a harsh environment (e.g., outer space, nuclear reactors, etc.), are shown and described. In addition, systems and processes for forming such substrates and assemblies are shown and described.

The high silica substrate discussed herein provides a combination of various properties that are believed to provide significant improvements over conventional substrate materials currently used in the high frequency circuit or harsh environment circuit applications.

For example, the high silica substrate discussed herein has a very high softening temperature (e.g., greater than 700 degrees C., 1000 degrees C., 1200 degrees C., etc.) which allows the high silica substrate to resist deformation or damage during high temperatures that the circuit or parts thereof may experience in certain harsh environment applications. In addition, the high silica substrate discussed herein has a very low coefficient of thermal expansion. The low coefficient of thermal expansion of the substrate discussed herein provides a harsh environment circuit with a very high level of dimensional stability over a very wide range of temperatures. Further, the low coefficient of thermal expansion of the substrate discussed herein provides for circuit materials (e.g., deposited copper or other metallization pathways) to be deposited on the substrate in a tight fit with a high level of bonding to the substrate.

In various embodiments, one or both major surfaces of the high silica substrate discussed herein may have a rough surface or a series of elongate raised ridges or recesses that increase the substrate surface area. This increased surface area may facilitate increased bonding with the metallization materials. In particular, the substrate discussed herein is particularly suitable for the inclusion of structures to enable bonding with metal contacts and for the machining of vias typically found in circuit substrates. Thus, the unique surface morphology of the substrate discussed herein may be particularly effective to bond metallization pathways for circuit or antenna applications, as discussed herein.

In addition, the high silica substrate discussed herein is both thin (e.g., less than 1 mm, less than 500 μm in thickness, less than 200 μm in thickness, etc.) and has relatively high strength (at least considering its low thickness), such as tensile strength of at least 30 MPa, such as at least 35 MPa, such as at least 40 MPa and/or compressive strength of at least 0.8 GPa, such as at least 1 GPa. These two properties may allow for a densely packed circuit on the substrate. In addition, the high silica substrate discussed herein is highly flexible providing a substrate that may be useful in flexible assemblies, such as flexible circuits or antennas.

Flexibility, in terms of stiffness or rigidity as may be measured by conventional bend testing, of substrates described herein may be asymmetric, such as due to general alignment of micro- and/or nano-structures disclosed herein (e.g., peaks/valleys), where the flexibility of the substrate about a first axis aligned with a surface of the substrate is greater (such as by at least 0.1%, such as by at least 0.5%, such as by at least 1%, such as by at least 2%) than flexibility of the substrate about a second axis aligned with the surface and orthogonal to the first axis. Such asymmetry in flexibility may be a "fingerprint" or attribute of substrates manufactured according to processes disclosed herein. In other contemplated embodiments, the flexibility may not be asymmetric or the asymmetry may be less than 0.1%. In some applications, asymmetry may facilitate rolling or folding of the substrate, such as rolling of a long length of the substrate about a reel, while providing increased relative strength along a central axis of the reel for stacking and storage purposes. The asymmetry may also be aligned such that the more flexible orientation of the substrate matches a direction that a device, such as a flexible display, antenna, PCB, or battery, incorporating the substrate, is intended to fold.

In addition, the substrate discussed herein provides these properties in conjunction with a very high purity (e.g., high silica content) that provides a substrate with material properties particularly advantageous for high frequency antenna or other high frequency circuit applications. For example, the substrate discussed herein has very low dielectric constant (Dk) and a very low dissipation factor (Df) suitable for high frequency (e.g., 5 GHz or higher, 10 GHz, 20 GHz, or higher) circuit or antenna applications. As will be understood, circuit substrates with low Dk and low Df help ensure both a high level of signal quality and transmission speed in high frequency applications. Additionally, as will be explained herein, Applicants have discovered that substrates manufactured according to the processes disclosed herein appear to have lower dielectric properties than conventional silica. Lastly, as compared to at least some other circuit substrates (e.g., silica boules), the substrate discussed herein may be formed in large, continuous ribbons having a number of the various advantageous features (e.g., thinness, high quality surfaces, strength, flexibility, purity, etc.) in the as-formed condition (e.g., without cutting, polishing, grinding, etc.). In some embodiments the substrate may be cut to large rectangular sheets, sheets larger than sheets that may be cut from silica boules, for example. By eliminating or decreasing the complexity of the substrate formation process, the substrate and related processes discussed herein allow for a scalable and relatively low cost method for producing circuits on a high silica content substrate as compared to at least some conventional processes such as boule processing.

Figure 1B:
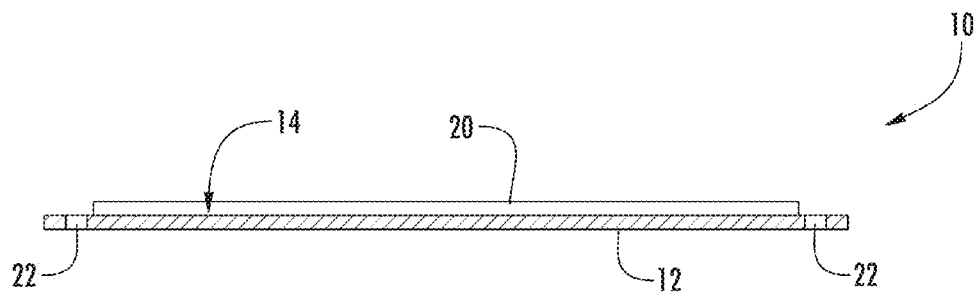
FIG. 1B shows a sectional view of the metallized silica substrate of FIG. 1A according to an exemplary embodiment.
Figure 2:
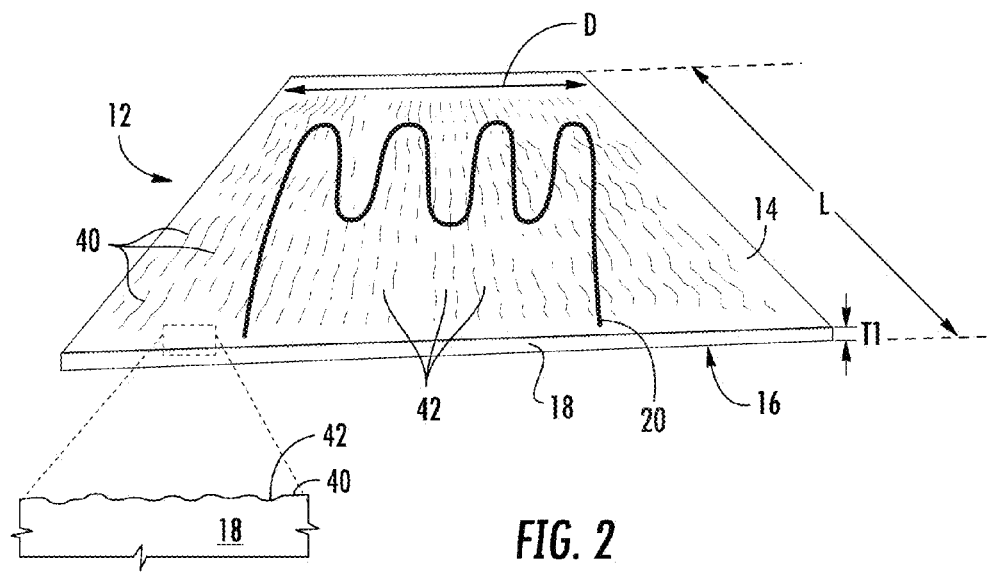
FIG. 2 is a schematic representation of a perspective view of a substrate according to an exemplary embodiment.

Referring to FIG. 1A and FIG. 1B, a metalized substrate 10 is shown. In general, metalized substrate 10 includes a high silica content substrate, shown as silica sheet 12. As shown in FIG. 2, silica sheet 12 includes a first major surface, shown as upper surface 14, and a second major surface, shown as lower surface 16, that is on the opposite side of sheet 12 from upper surface 14. Silica sheet 12 includes an outer perimeter surface, shown as sidewall surface 18 that extends between outer most edges of upper surface 14 and lower surface 16.

Referring to FIG. 1A and FIG. 1B, substrate 12 supports one or more layer of conductive material such as a metal material, shown as metalized conductive pathway 20. In this arrangement, the metal material of conductive pathway 20 is in contact with or bonded to upper surface 14 of substrate 12. Metalized substrate 10 may be one or more layer in an electrically conductive device, such as printed circuit board, a circuit board for use in a harsh environment, or a high frequency antenna. Metalized substrate 10 also includes one or more via 22 formed through substrate 12 which provide an area for metallization and electrical conduction between adjacent layers in a device utilizing metalized substrate 10. In some embodiments, metallization connects to vias and/or includes conductive content of vias. Vias 22 are through-vias formed through the entire thickness of substrate 12 and extending between upper surface 14 and lower surface 16 of substrate 12. As will be explained in greater detail herein, silica sheet 12 provides various material and physical properties that provide for improved performance relative to conventional circuit and antenna substrate materials, such as PTFE and thermoset hydrocarbon resin.

In various embodiments, silica sheet 12 may include various surface structures that facilitate formation or deposition of metallized pathways or metallized vias. As discussed in more detail below, in some embodiments, these surface features are features present in silica sheet 12 as-formed (e.g., without secondary formation steps), such as various patterns of ridges and depressions. In other embodiments, silica sheet 12 may include various surface features or non-through holes formed via a secondary process as needed for various circuit board or antenna designs. For example, partial vias or grooves may be machined or imprinted into upper surface 14 and/or lower surface 16 of attachment or alignment of various components that interact with or are electrically coupled to metalized substrate 10. In various embodiments, surface 14 and/or surface 16 of silica sheet 12 may include at least one surface feature configured to receive deposition of a layer of metal material, such as metallized pathway 20, and to bond the metal layer to the substrate surfaces such that the layer of metal material following deposition forms a pattern on the substrate surface. In some embodiments, the surface features of the substrate are the elongate features of the as-formed substrate, discussed below, and in other embodiments that may be features, such as grooves or primer/precursor paths, machined, imprinted or deposited onto one of the surfaces of silica sheet 12.

The various metal layers or pathways may be deposited using any suitable deposition method. In one embodiment, metalized pathways 20 are formed by gravure offset printing of primer or precursor material in the desired pattern and then electroplating the conductive material, specifically copper, in the arrangement to form the desired circuit or antenna. In embodiments utilizing a primer or precursor, a layer of primer or precursor material is located between the substrate surface and the material of metalized pathway 20.

In various embodiments, metalized substrate 10 discussed herein may be used in a wide variety of applications, in which the various physical properties discussed herein (e.g., low Dk, low Df, thin, flexibility, strength, etc.) are advantageous. For example, metalized substrate 10 is used in an antenna application, and metallized pathway 20 is shaped and/or configured to receive and/or transmit signals at a high frequency. In specific embodiments, metalized pathway 20 is an antenna configured to receive and/or transmit signals at 5 GHz, 10 GHz, 15 GHz, 20 GHz, 25 GHz, 30 GHz, 40 GHz etc. In various embodiments, metalized pathway 20 is an antenna shaped and/or configured to receive and/or transmit signals within a variety of frequency ranges, such as 5 GHz to 40 GHz, 5 GHz to 30 GHz, 5 GHz to 20 GHz, 5 GHz to 15 GHz, 8 GHz to 12 GHz, 13 GHz to 17 GHz, 18 GHz to 22 GHz, 23 GHz to 27 GHz, etc. The material properties, such as the low Dk and the low Df provided by silica sheet 12, allow for an antenna with a high level of signal quality and transmission speed even at these very high frequency ranges. For higher frequency ranges, narrower the metal lines may improve fidelity of the corners. Metalized lines can be created as thin as needed for the antenna design with substrates disclosed herein, at least in part due to rigidity of the substrates and/or the composition, which may be conducive to laser machining.

Referring to FIG. 2, upper surface 14 and/or lower surface 16 of sheet 12 includes a non-flat or non-polished surface texture or profile that includes a plurality of raised features 40 and recessed features 42. In various embodiments, raised features 40 and recessed features 42 have irregular profile shapes in cross-section as shown in FIG. 2. In other embodiments, raised features 40 and recessed features 42 have a consistent or repeating profile shape in cross-section.

In various embodiments, at least some of the raised features 40 extend from the surface of sheet 12 a distance of at least 10 angstroms further than the recessed features 42, such as at least 50 angstroms, such as at least 100 angstroms, such as at least 500 angstroms. In some embodiments, raised features 40 extend from the surface of sheet 12 a distance of at least 1 μm beyond the lowest portion of upper surface 14 (e.g., the lowest of the lowest recessed portion), and more specifically at least 2 μm beyond the lowest recessed portion. In various embodiments, upper surface 14 and/or lower surface 16 are primarily unpolished such that the surface has a surface roughness Ra of greater than 1.5 angstrom for a 40 μm by 30 μm area thereon, which may be a subsection of the total area of surface. In another embodiment, however, upper surface 14 and/or lower surface may be polished such that that surface roughness Ra is less than 1.5 angstrom for a 40 μm by 30 μm area section.

In various embodiments, the surface texture provided by raised features 40 and recess features 42 may provide a surface that facilitates bonding to various layers utilized in a circuit board or antenna application (e.g., metalized pathways). For example, raised features 40 and recessed features 42 may increase the surface area of upper surface 14 and/or lower surface 16 (as compared to a flat or polished surface) providing additional area for metallized pathways 20 to be bonded to sheet 12. Further, it is believed that raised features 40 and recessed features 42 may provide for a more robust connection between sheet 12 and metallized pathway 20 by forming somewhat of an interlocking engagement between the adjacent surfaces. In such embodiments, a metalized layer, such as metallized pathway 20, extends over one or more raised features 40 and/or one or more recessed features 42. In such embodiments, this interface between the metalized layer and the topology of the substrate surface having raised features 40 and recessed features 42 improves bonding between the metal layer and the substrate.

In various embodiments, the presence of raised features 40 and recessed features 42 provides upper surface 14 and/or lower surface 16 with an area that is greater than the area of the same shaped surface that is polished smooth. In specific embodiments, the surface area of upper surface 14 or of lower surface 16 is greater than the area of a cross-section shape defined by sidewall 18. In specific embodiments, the surface area of upper surface 14 or of lower surface 16 is at least 1.5 times greater than the area of a cross-section shape defined by sidewall 18, and more specifically is at least 2 times greater than the area of a cross-section shape defined by sidewall 18. In specific embodiments, the area of upper surface 14 and/or of lower surface 16 is greater than 1 mm$^2$, and more specifically is greater than 2 mm$^2$.

Figure 3:
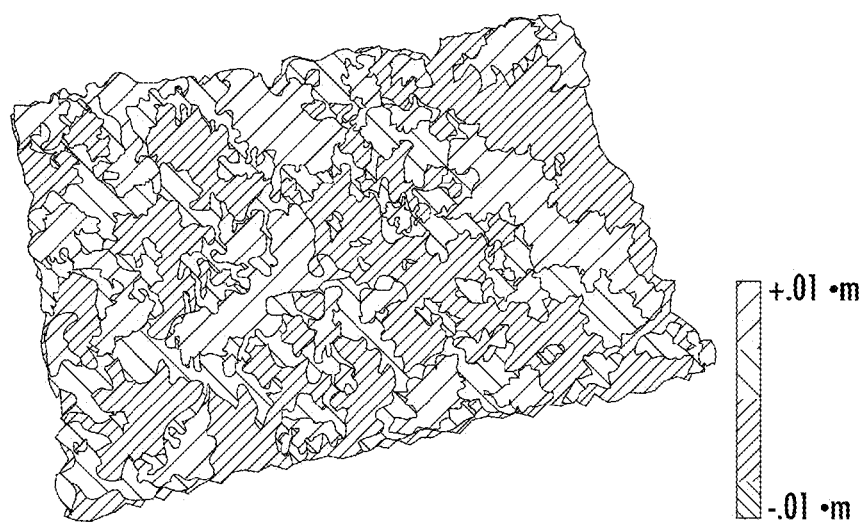
FIG. 3 is a 3D nano-scale representation of a measured profile of a surface of substrate according to an exemplary embodiment.
Figure 4:
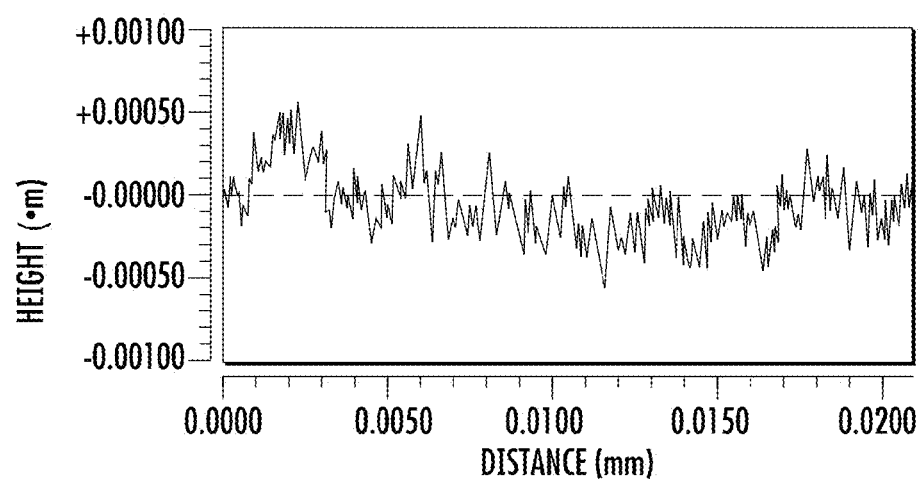
FIG. 4 is a 2D nano-scale representation of a measured profile of the surface of FIG. 3.

Referring to FIG. 3 and FIG. 4, examples of an unpolished surface of sheet 12 are shown according to various exemplary embodiments. For example, FIG. 3 shows a 3D representation of a 40 μm by 30 μm area of upper surface 14 of sheet 12 according to an exemplary embodiment. FIG. 4 shows a 2D representation of nanostructure of the same substrate sample as FIG. 3. Both FIGS. 3 and 4 show the raised and recessed features 40, 42 of surface 14 on a nano-scale, where upper surface 14 is non-flat or unpolished.

Referring back to FIG. 2, sheet 12 has a thickness, shown as T1, that generally is the distance between opposing portions of upper surface 14 and lower surface 16. In some embodiments discussed herein T1 is a specific thickness between two opposing points along upper surface 14 and lower surface 16, and in other embodiments, T1 is an average thickness between all opposing points along upper surface 14 and lower surface 16. In some embodiments, sheet 12 has a thickness T1 of less than 1 mm, such as less than 500 μm, such as less than 250 μm, and in some such embodiments less than 50 μm. According to an exemplary embodiment, T1 is between 200 μm and 1 μm, specifically between 200 μm and 5 μm and more specifically between 150 μm and 5 μm. In a particularly thin embodiment, T1 is between 1 μm and 20 μm. Thus, according to these exemplary embodiments, sheet 12 is arranged as a particularly thin sheet of silica material. Such a thin sheet may be counter-intuitive for substrate manufacturers due to the processes of cutting, grinding, lapping, and polishing, which may require or benefit from a greater thickness in order for the handling needed for the cutting, grinding, lapping, polishing, etc.

According to an exemplary embodiment, sheet 12 has a first minimum dimension D orthogonal to the thickness (e.g., width, length, minimum surface dimension) and a second minimum dimension L orthogonal to the thickness and orthogonal to dimension D. In various embodiments, D and/or L are each less than 100 m and greater than 1 mm, and specifically are less than 5 m and greater than 2 mm. Such dimensions may be useful for circuit or antenna applications and in conjunction with equipment that deposits metalized pathways for circuit and antenna forming equipment.

In various embodiments, sheet 12 may be formed in a variety of shapes as needed for circuit or antenna assemblies. For example, in at least some applications, silica sheet 12 may be shaped to specifically conform to a shape within a device housing which in turn facilitates the efficient use of space within the device housing. In various embodiments, as shown in FIG. 2, sheet 12 has a cross-sectional shape defined by sidewall 18 that is non-circular, and specifically is rectilinear. In other embodiments, sheet 12 may be circular in shape or polygonal in shape, and in yet other embodiments, sheet 12 may have an irregularly shaped sidewall 18 that is shaped to conform to components and/or to fill otherwise empty space within a device housing.

According to an exemplary embodiment, the sheet 12 is transparent at wavelengths in the visible range, in the ultraviolet range and/or in the deep ultraviolet range, and/or in the near infrared range. In some embodiments, for thicknesses disclosed herein, the sheet 12 has a transmittance of at least 40% at a wavelength of 170 nm, such as at least 50%. Transparency may facilitate manufacturing and/or assembly of the device by allowing optical alignment and use of optical sensors that operate through one or more layers of the sheets 12 in the respective device or componentry thereof.

As used herein, the term "substrate" generally refers to a substance, layer or material that may underlie something, or on which some process may occur. For example, the substrate may be a top layer of a multilayered structure, an exterior layer, an internal layer, etc.

In some embodiments, sheet 12 consists of at least 90% by weight, specifically at least 99% by weight, and more specifically at least 99.99% by weight of a material of the composition of $(SiO_2)_{1-x-y} \cdot M'_x M''_y$, where either or both of M' and M" is an element (e.g., a metal) dopant, or substitution, which may be in an oxide form, or combination thereof, or is omitted, and where the sum of x plus y is less than 1, such as less than 0.5, or where x and y are 0.4 or less, such as 0.1 or less, such as 0.05 or less, such as 0.025 or less, and in some such embodiments greater than $1E^{-6}$ for either or both of M' and M". In some embodiments, the substrate is highly pure fused quartz, such as at least 99.5% quartz, such as 99.9% quartz. In some embodiments, the substrate is highly pure $SiO_2$, such as at least 90% $SiO_2$, 95% $SiO_2$, 99% $SiO_2$, 99.5% $SiO_2$, 99.9% $SiO_2$, 99.99% $SiO_2$, 99.999% $SiO_2$, 99.9999 $SiO_2$, 99.99999% $SiO_2$. In some embodiments, the substrate is highly pure $SiO_2$, such as between 99.9999 $SiO_2$ and 99.99999% $SiO_2$. In some embodiments, the substrate is highly pure $SiO_2$ at surface 14 and/or surface 16, such that the $SiO_2$ content at the surfaces is between 99.9999 $SiO_2$ and 99.99999% $SiO_2$. In certain embodiments, sheet 12 is crystalline, and in some embodiments, sheet 12 is amorphous. In some embodiments, sheet 12 is a fused quartz material. In one embodiment, sheet 12 is a fully sintered silica sheet. In another embodiment, sheet 12 is a partially sintered silica sheet. In another embodiment, sheet 12 is unsintered silica soot sheet.

In specific embodiments, silica sheet 12 is formed having very low levels of contaminant elements common in some silica materials formed by other methods. In specific embodiments, silica sheet 12 has a total sodium (Na) content of less than 50 ppm. In various embodiments, the sodium content of silica sheet 12 is substantially consistent throughout sheet 12 such that the total sodium content is less than 50 ppm at all depths within silica sheet 12. This low total sodium content and the even sodium distribution is in contrast to some silica structures (e.g., silica boules) which have higher overall sodium content that varies at different depths within the boule. In various embodiments, it is believed that the low sodium content discussed herein provides silica sheet 12 with optical loss reduction, index of refraction uniformity and chemical purity/non-reactivity as compared to other silica materials with higher sodium content, and such characteristics are believed to be particularly suited to some applications, such as harsh environment circuit boards and/or high frequency antennas.

In other embodiments, silica sheet 12 has a low level of hydroxyl (OH) concentration. In various embodiments, the OH concentration can be controlled to impact the viscosity, refractive properties, and other properties of silica sheet 12. In various embodiments, beta OH is less than 0.02 abs/mm and more specifically is less than 0.002 abs/mm. In some embodiments, the OH concentration of silica sheet 12 formed using a laser sintering system as discussed herein is less than the OH concentration of silica material formed using some other formation methods (e.g., plasma sintering, flame sintering and/or sintering process that dry using chlorine prior to sintering). In contrast to some silica materials that utilize a surface treatment with a material such as hydrofluoric acid, silica sheet 12 has a low surface halogen concentration and a low surface OH concentration.

In various embodiments, silica sheet 12 has a fictive temperature (Tf) that is higher than the Tf of at least some silica materials, such as silica boules. For example, it is believed that at least in some embodiments, silica sheet 12 has a fictive temperature between 1100 degrees C. and 2000 degrees C., specifically between 1500 degrees and 1800 degrees C., and more specifically between 1600 degrees C. and 1700 degrees C. In a specific embodiment, silica sheet 12 has a fictive temperature of about 1635 degrees C. (e.g., 1635 degrees C. plus or minus 1%).

In various embodiments, the very high silica content of sheet 12 has various properties that make sheet 12 particularly well suited for high frequency antenna applications. In particular, sheet 12 has both a very low dielectric constant (Dk) and a very low dissipation factor (Df). In various embodiments, silica sheet 12 has a Df of less than 0.003 and a Dk less than 3. In various embodiments, silica sheet 12 has a Df of less than 0.003 and a Dk less than 3 in an antenna application receiving/transmitting signals at 10 GHz. In various embodiments, silica sheet 12 has a Df of less than 0.003 and a Dk less than 3 in an antenna application receiving/transmitting signals at 20 GHz. In various embodiments, silica sheet 12 has a Df of less than 0.003 and a Dk less than 4. In various embodiments, silica sheet 12 has a Df of less than 0.003 and a Dk less than 4 in an antenna application receiving/transmitting signals at 10 GHz. In various embodiments, silica sheet 12 has a Df of less than 0.003, and a Dk less than 4 in an antenna application receiving/transmitting signals at 20 GHz. In various embodiments, silica sheet 12 has a Df of less than 0.002 and a Dk less than 3.5. In various embodiments, silica sheet 12 has a Df of less than 0.001 and a Dk less than 3.4. In specific embodiments, silica sheet 12 provides a substrate with a very low Df and Dk without the need for additional layers of low Df and Dk material layered on silica sheet 12 (e.g., metalized pathways or the metallization precursors are directly bonded to the surface of silica sheet 12). This combination of both low Df and low Dk is distinct from typical polymer or fiberglass/polymer antenna substrates that have a low Dk, but typically have a Df that is significantly higher than that of silica sheet 12.

In various embodiments, sheet 12 has a high softening point temperature, that being greater than 700° C., such as greater than 800 C, such as greater than 900° C., such as greater than 1000° C. Such high softening temperatures allows silica sheet 12 to function well as a substrate for a circuit or antenna intended for use in a high temperature environment, such as furnaces, jet engines, rocket engines, nuclear power plant reactors, etc. In addition, silica sheet 12 has a low coefficient of thermal expansion, that being less than $10 \times 10^{-7}/°$ C. in the temperature range of 50 C to 300° C., such as $5.5 \times 10^{-7}/°$ C. in the same temperature range. The low coefficient of thermal expansion of sheet 12 provides structural and dimensional stability to the device utilizing metalized substrate 10 even when experiencing large changes in temperature, such as may be experienced in certain harsh environments, such as experienced in space by space vehicles, satellites, etc. Further, it is believed that the thermal properties and thermal stability of sheet 12 will generally result in circuits/antenna with longer useable life as compared to polymer-based substrates.

In various embodiments, sheet 12 is a strong and flexible substrate which may allow metalized substrate 10 to be flexible. In various embodiments, sheet 12 is bendable such that the thin sheet bends to a radius of curvature of at least 500 mm without fracture when at room temperature of 25° C. In specific embodiments, sheet 12 is bendable such that the thin sheet bends to a radius of curvature of at least 300 mm without fracture when at room temperature of 25° C., and more specifically to a radius of curvature of at least 150 mm without fracture when at room temperature of 25° C. Bending of sheet 12 may also help with roll-to-roll applications, such as processing across rollers in automated manufacturing equipment, such as circuit or antenna manufacturing line. This may allow formation using high throughput manufacturing techniques such as those used in semiconductor processing.

In various embodiments, sheet 12 is a transparent or translucent sheet of silica glass. In one embodiment, sheet 12 has a transmittance greater than 90% and more specifically greater than 95%. In various embodiments, sheet 12 also is light weight allowing a decrease in the total weight of the conductive device, such as a circuit or antenna, utilizing sheet 12.

In some embodiments, silica sheet 12 is a fully sintered silica glass sheet including voids or bubbles such that the density of the sheet is less than 2.2 g/cc. In various embodiments, the soot sheet that silica sheet 12 has a starting density between 0.2 g/cc to 0.8 g/cc, and silica sheet 12 is a fully sintered silica glass sheet having a density of about 2.2 g/cc (e.g., 2.2 g/cc plus or minus 1%). In various other embodiments, the soot sheet that silica sheet 12 is formed from has a starting density between 0.2 g/cc to 0.8 g/cc, and silica sheet 12 is a partially sintered silica glass sheet having a density between 0.2 g/cc and 2.2 g/cc.

Figure 5:
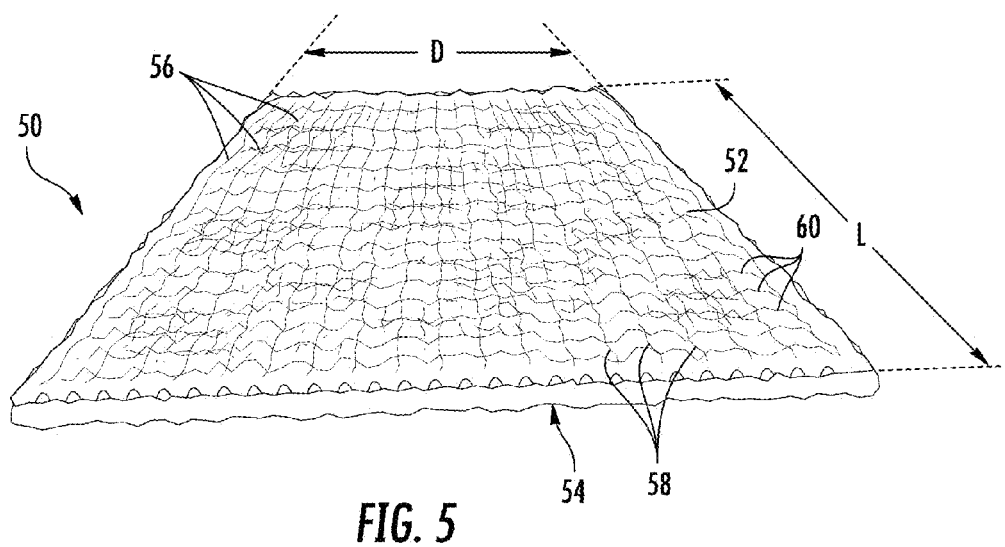
FIG. 5 is a schematic representation of a perspective view of a substrate according to another exemplary embodiment.

Referring generally to FIG. 5, a high silica content substrate, shown as silica sheet 50, is shown according to an exemplary embodiment. Silica sheet 50 is substantially the same as sheet 12 except as discussed herein. In general, silica sheet 50 includes a first major surface, shown as upper surface 52, and a second major surface, shown as lower surface 54. In the embodiment shown, sheet 50 includes intersecting elongate features 56 (e.g., raised elongate features, recessed elongate features, grooves, ridges, channels, canals, etc.). In some embodiments, some or all of the elongate features 56 have a length that is at least ten times a width thereof. According to an exemplary embodiment, at least some of the elongate features 56 have a width that is greater than 2 μm and less than 10 mm, such as greater than 10 μm and less than 5 mm, such as greater than 50 μm and less than 2 mm. In one embodiment, width of elongate features 56 is the distance between points on either side of a peak that goes below average surface elevation. For such embodiments, texture of the surface 52 and 54 is at least in part formed by the intersecting elongate features 56, such as in addition to unpolished nanostructure as shown in FIGS. 2 and 3.

In some embodiments, elongate features 56 include a first group of raised features 58 and a second group of raised features 60 that both extend outward from upper surface 52. In various embodiments, lower surface 54 includes raised features 58 and 60 similar to upper surface 52. In one embodiment, raised features 58 and 60 form a pattern of crisscrossing elongate features. In the embodiment shown, raised features 58 generally extend in the direction of dimension L, and raised features 60 generally extend in the direction of dimension D, and in this arrangement, raised features 58 and 60 intersect each other forming a grid-like pattern. In a specific embodiment, raised features 58 are linear features that are generally parallel to dimension L, and raised features 60 are linear features parallel to dimension D. However, in other embodiments, raised features 58 and 60 may be at nonperpendicular angles relative to each and may be nonparallel to dimensions L and D, respectively, and in some embodiments, raised features 58 and 60 may be nonlinear. Similar to raised features 40 (shown in FIG. 2), raised features 58 and 60 may extend a distance of at least 1 μm above the lowest point of the surface 52, specifically as at least 2 μm above, and more specifically such as at least 5 μm above.

Figure 6:
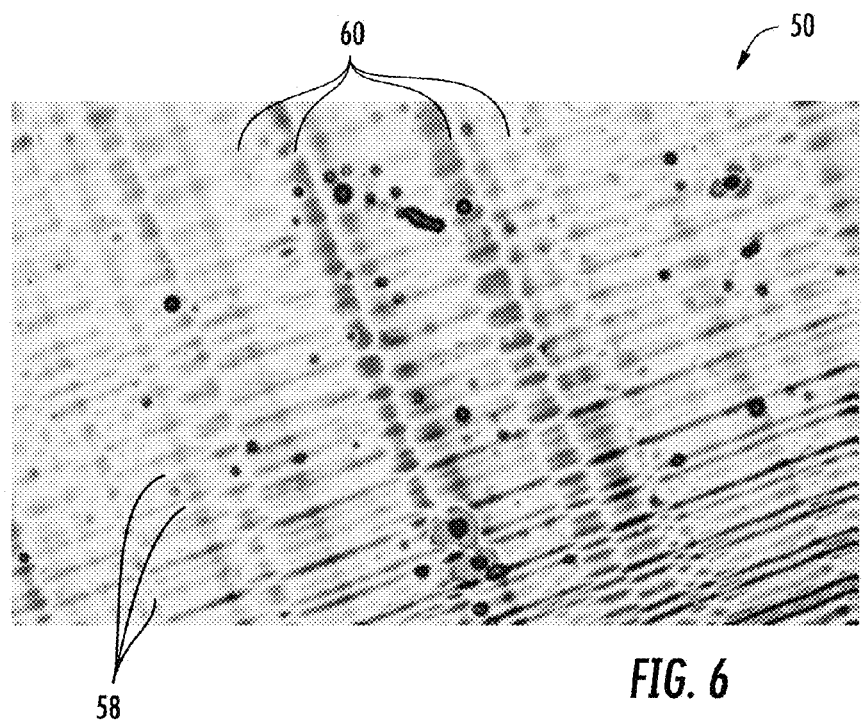
FIG. 6 is a 3D micro-scale representation of a measured profile of a surface of a substrate according to an exemplary embodiment.

As shown in FIG. 6, a 3D micro-scale representation of the profile of upper surface 52 of sheet 50 is shown according to an exemplary embodiment. Control of the shape and orientation of the elongate features may be achieved by laser sinter, as described herein. The intersecting elongate features 56 may facilitate bonding with the deposited metal layers as discussed herein.

Figure 7:
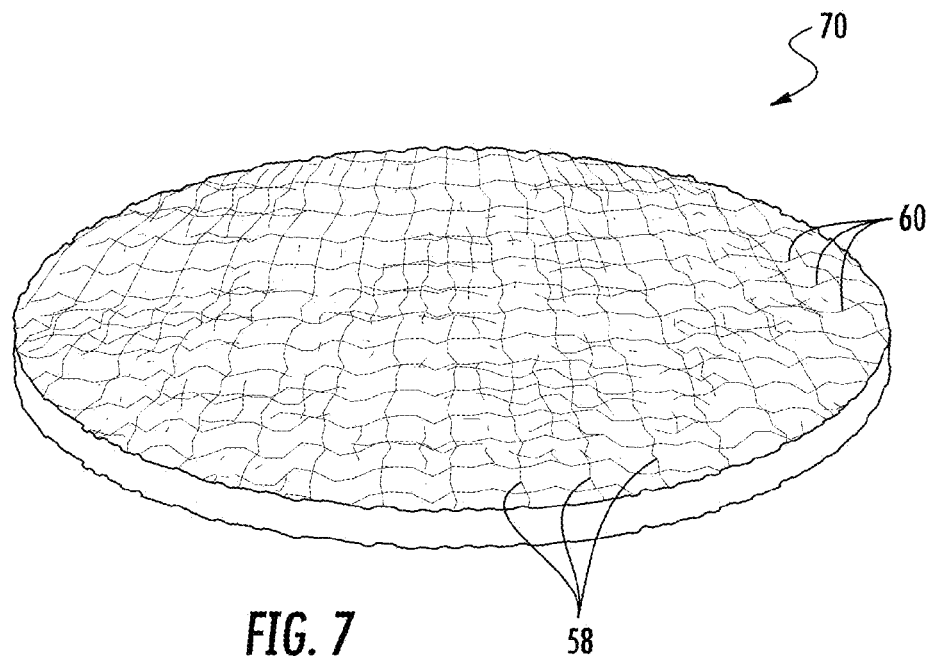
FIG. 7 is a schematic representation of a perspective view of a substrate according to another exemplary embodiment.

Referring to FIG. 7, a high silica content substrate, shown as silica sheet 70, is shown according to an exemplary embodiment. Silica sheet 70 is substantially the same as sheet 50 except as discussed herein. Sheet 70 is circular in cross-sectional shape.

Figure 8:
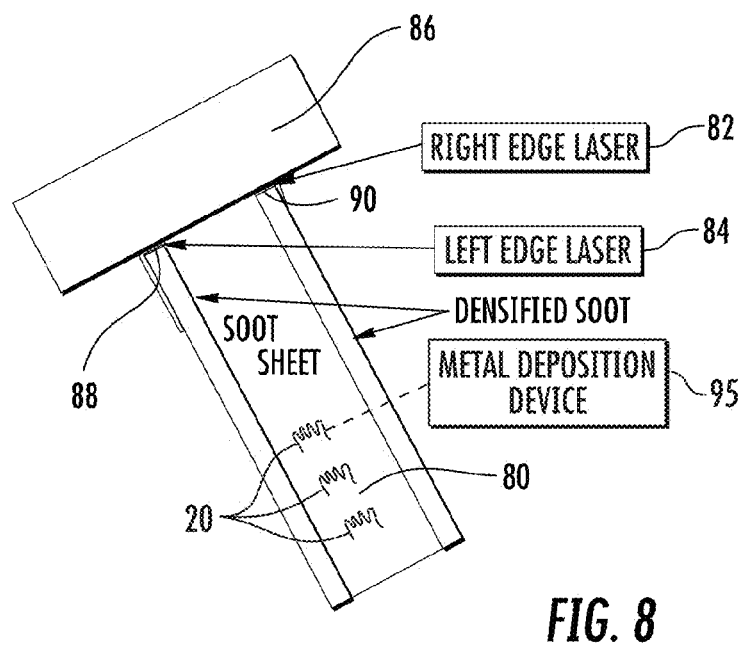
FIGS. 8 and 9 are schematic representations of a perspective view of substrates manufactured according to exemplary embodiments.
Figure 9:
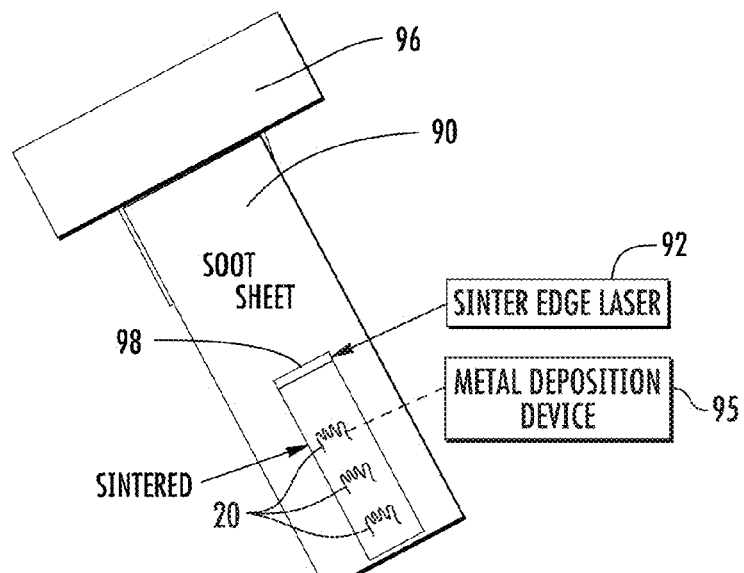

Referring now to FIG. 8 and FIG. 9, soot sheets 80, 90 (e.g., sheet of $SiO_2$ soot, quartz soot, a soot form of a glass or precursor thereof, such as any glass material described herein) are shown. In one embodiment, soot sheets 80, 90 may be sintered and used as substrates as described herein, and in another embodiment, soot sheets 80, 90 may be partially sintered or unsintered and used as a substrate as discussed herein. For example, in various embodiments, soot of soot sheets 80, 90 may be pressed into a sheet having a low density, such as less than 1.5 g/cm³, such as less than 1 g/cm³, such as less than 0.5 g/cm³. FIG. 8 and FIG. 9 show lasers 82, 84, 92 (e.g., $CO_2$ lasers, greater than 100 Watt laser, greater than 200 W laser, less than 2000 W laser) at least partially sintering and/or densifying the respective soot sheets 80, 90, which are extending from manufacturing equipment 86, 96 such as a soot deposition rotor, tread, wheel, roller, or other such equipment.

While other sintering devices may be used to achieve some embodiments, Applicants have discovered advantages with laser sintering in the particular ways disclosed herein. For example, Applicants found that laser sintering may not radiate heat that damages surrounding equipment or overheat and burn up the susceptor (e.g., platinum susceptor, graphite) which may be a concern with sintering via induction heating and resistance heating. Applicants found that laser sintering has good control of temperature and repeatability of temperature and may not bow or otherwise warp the ribbon, which may be a concerns with flame sintering. In comparison to such other processes, laser sintering may provide the required heat directly and only to the portion of the soot sheet needing to be sintered. Laser sintering may not send contaminates and gas velocity to the sintering zone, which may upset manufacturing of the thin sheets. Further, laser sintering is also scalable in size or for speed increases.

According to an exemplary embodiment, laser(s) 82, 84, 92 may be directed by lenses (e.g., on ends thereof, spaced apart therefrom) to form a laser energy plane 88 (e.g., beam of rectangular cross-section), 90, 98 to sinter the soot sheet to glass, such as to produce a ribbon of high viscosity glass. Some embodiments of the process include fully sintering the soot sheet from low density soot sheet (e.g., 0.5 g/cm³) to fully sintered, such as having a density greater than 1.0 g/cm³, such as greater than 1.5 g/cm³, such as greater than 2.0 g/cm³ (e.g., 2.2 g/cm³) or more, such as by any of the above processes, and preferably by the laser(s) 82, 84, 92.

Other embodiments include partially sintering the soot sheet 80 such that the soot sheet has a density greater than 0.5 g/cm³ and/or less than 2.2 g/cm³. Partially sintered soot sheets may hold together better than unsintered sheets, such as being able to be rolled on a spool (e.g., spool diameter of at least 1 in and/or no more than 12 in). In contemplated embodiments, unsintered soot sheets or partially sintered soot sheets, of materials as described herein, may be used as end products, such as serving as substrates, layers, barriers, etc., such as to receive and support layers of metal materials or for other purposes.

Referring to FIG. 8 and FIG. 9, in some embodiments the process at least partially (e.g., fully) sinters columns or other shapes of glass or densified soot through the soot sheet in selected patterns. Alternatively, masking may be used to isolate portions of the soot sheet, which may then be removed or otherwise sintered to create geometry, such as a patterned profile for cathode deposition. Some such selective and/or partial sintering may not be possible or may be extremely difficult with processes other than laser sintering. In some embodiments, use of a laser to sinter the edges of the soot sheet fully or partially, just prior to removing the soot sheet from the manufacturing line (e.g., following deposition on a rotor) overcomes processing issues where edges or ends of the soot sheet may tear or crack. This full or partial sintering of the edges prior to sheet removal from the manufacturing line may strengthen the edge and inhibit tearing or cracking. It may also act as a frame to facilitate carrying samples to the next fabrication stage.

In various embodiments, following the formation of a high silica sheet as shown in FIG. 8 and FIG. 9, one or more metal layer or metalized pathway may be deposited onto the upper or lower surface of the silica substrate (such as sheets 12, 50, 70, etc.). In various embodiments, the formation process relates to formation of a metalized substrate 10 as discussed above. For example as shown in FIG. 9, a metal deposition device 95 (e.g., an electroplating device) may deposit metal in the desired pattern on the fully sintered or partially sintered silica material to form metalized pathway 20, as discussed above. As noted above, metal deposition device may deposit a primer or precursor in the desired pattern prior to the deposition of the metal material.

As used herein, the silica ($SiO_2$) containing sheet may be a thin sheet formed from deposited silica soot, may also be a thin sheet of silica glass formed by fully sintering the silica soot sheet, and may also be a thin sheet of partially sintered silica soot. In various embodiments, the silica soot sheets disclosed herein are formed by a system that utilizes one or more glass soot generating device (e.g., a flame hydrolysis burner) that is directed or aimed to deliver a stream of glass soot particles onto a soot deposition plate. As noted above, the silica sheets discussed herein may include one or more dopant. In the example of a flame hydrolysis burner, doping can take place in situ during the flame hydrolysis process by introducing dopant precursors into the flame. In a further example, such as in the case of a plasma-heated soot sprayer, soot particles sprayed from the sprayer can be pre-doped or, alternatively, the sprayed soot particles can be subjected to a dopant-containing plasma atmosphere such that the soot particles are doped in the plasma. In a still further example, dopants can be incorporated into a soot sheet prior to or during sintering of the soot sheet. Example dopants include elements from Groups IA, IB, IIA, IIB, IIIA, IIIB, IVA, IVB, VA, VB and the rare earth series of the Periodic Table of Elements. In various embodiments, the silica soot particles may be doped with a variety of materials, including germania, titania, alumina, phosphorous, rare earth elements, metals and fluorine.

Figure 10:
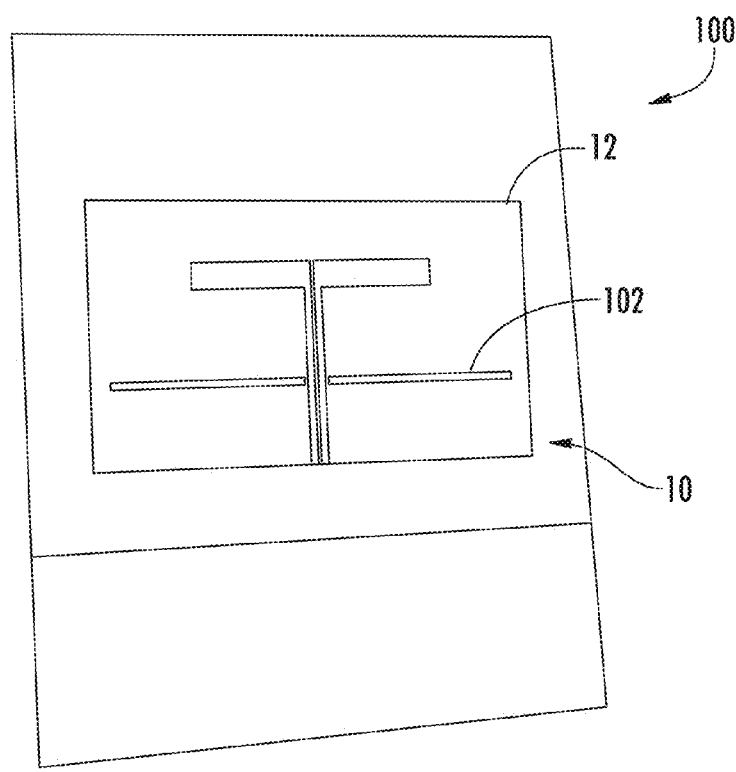
FIG. 10 is a top plan view of a high frequency antenna including a high silica content substrate according to an exemplary embodiment.

Referring to FIG. 10, an electrically conductive device, shown as high frequency antenna device 100, utilizes a metalized substrate 10. Antenna device 100 includes layers of conductive material, forming antenna 102, supported by silica sheet 12. In the specific embodiment shown in FIG. 1C, antenna 102 is shaped and/or configured to receive and/or transmit high frequency signals, such as 10 GHz signals.

The following Table summarizes measured properties from actual samples manufactured according to processes disclosed herein and tested.

| GHz | Thickness [mm] | dielectric constant[Dk] | Dielectric loss [Df] | loss Tangent δ | Sinter |
|---|---|---|---|---|---|
| 9.98 | 0.095 | 3.774 | −0.00018 | −0.00006 | full |
| 9.98 | 0.113 | 3.339 | 0.00077 | 0.00023 | full |
| 9.98 | 0.111 | 3.53 | | 0.00002 | full |
| 22.78 | 0.111 | 3.53 | | 0.00002 | full |
| 9.98 | 0.104 | 3.53 | | −0.00005 | full |
| 22.7 | 0.104 | 3.65 | | 0.00003 | full |
| 9.98 | 0.174 | 2.442 | | 0.00003 | partial |
| 22.78 | 0.174 | 2.551 | | 0.00002 | partial |

Full sinter corresponds to fully dense silica; while partial is less than fully dense, in this case about 75% dense. For full sinter, high purity fused silica cut from a boule, at 1.016 mm thickness and 9.33 and 22.7 GHz, Applicants found dielectric constant Dk of 3.88 and 3.84, loss tangent of 0.00023 and 0.00009, respectively. Accordingly, in some embodiments, a sheet 22 of fully sintered and fully densified high purity fused silica has a dielectric constant of less than 3.8, such as less than 3.7, such as less than 3.6, and/or at least 3. In some embodiments, a sheet 22 of fully sintered and fully densified high purity fused silica has a dielectric loss of a magnitude that is less than 0.001, such as less than 0.0008, such as less than 0.0005, in some embodiments, and/or at least 0.0001 in magnitude. In some embodiments, a sheet 22 of fully sintered and fully densified high purity fused silica has a loss tangent of less than 0.00009 in magnitude, such as less than 0.00005, which may be particularly advantageous for antenna devices.

As may be apparent from the above disclosure, in some embodiments the substrates disclosed herein may be processed (e.g., polished, etched) to reduce and/or remove at least some of the raised and/or recessed features. The surface features may be reduced to facilitate stacking of the substrates, for example, but retained to a lesser degree to provided benefits disclosed herein or for other reasons, such as reduced polishing time and cost. As may be apparent from the above disclosure, the substrates disclosed herein may be identified as semiconductor substrates in at least some embodiments. Absorptivity is abbreviated abs, where abs/mm is path length per sample length for silica.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more than one component or element, and is not intended to be construed as meaning only one.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. A device comprising:
    a high silica content substrate comprising:
        a first major surface;
        a second major surface opposite the first major surface;
        at least 90% SiO$_2$ by weight;
        an average thickness between the first major surface and the second major surface of less than 1 mm;
        wherein the first major surface comprises a plurality raised features and a plurality of recessed features formed in the first major surface and integrally part of the substrate, wherein at least some of the raised features extend from the surface a distance of at least 50 angstroms further than the recessed features;
        a first group of a plurality of raised elongate features formed in the first major surface and extending in the direction of the width, wherein each raised elongate feature of the first group has a length and a width and the length is at least ten times larger than width, wherein the width of each elongate feature of the first group is between 10 mm and 2 µm;
        a second group of a plurality of raised elongate features formed in the first major surface and extending in the direction of the length, wherein at least some of the raised elongate features of the second group intersect raised elongate features of the first group, wherein each raised elongate feature of the second group has a length and a width and the length is at least ten times larger than width, wherein the width of each raised elongate feature of the second group is between 10 mm and 2 µm;
        wherein the substrate has asymmetry in flexibility; and
    a layer of metal material supported by the first major surface, wherein the layer of metal material forms a pathway on the first major surface and is configured to conduct current along the pathway, wherein the layer of metal material extends over at least one recessed feature and at least one raised feature.

2. The device of claim 1, wherein the layer of metal material is coupled to the substrate by interlocking engagement between adjacent surfaces of the layer of metal material and the substrate such that the pathway extends over one or more of the raised features and/or one or more of the recessed features.

3. The device of claim 2, wherein the pathway has fine lines or points configured to operate at high frequency or equiangular radiation pattern.

4. The device of claim 3, wherein the layer of metal material is patterned, repeated in a regular array for beam steering applications.

5. The device of claim 4, wherein the metal pattern is an antenna emitting normal to the surface.

6. A device comprising:
    a high silica content substrate comprising:
        a first major surface;
        a second major surface opposite the first major surface;
        at least 99.9% SiO$_2$ by weight, wherein the SiO$_2$ is amorphous;
        a thickness between the first major surface and the second major surface of less than 250 µm; and
    a layer of metal material bonded to the first major surface of the substrate, wherein the layer of metal material forms a metallized pathways on the first major surface configured to conduct current, wherein the metallized pathways and the substrate have an interlocking engagement between adjacent surfaces at least in part due to raised features and recessed features on the first major surface of the substrate,
    a first group of a plurality of raised elongate features formed in the first major surface and extending in the direction of the width, wherein each raised elongate feature of the first group has a length and a width and the length is at least ten times larger than width, wherein the width of each elongate feature of the first group is between 10 mm and 2 µm;
    a second group of a plurality of raised elongate features formed in the first major surface and extending in the direction of the length, wherein at least some of the raised elongate features of the second group intersect raised elongate features of the first group, wherein each raised elongate feature of the second group has a length and a width and the length is at least ten times larger than width, wherein the width of each raised elongate feature of the second group is between 10 mm and 2 µm;
    wherein at least some of the raised features extend from the surface a distance of at least 50 angstroms further than the recessed features.

7. The device of claim 6, wherein the device is an antenna and the layer of metal material is patterned to transmit signals at a frequency greater than 5 GHz.

8. The device of claim 6, wherein the layer of metal material is patterned to transmit signals at a frequency greater than 10 GHz.

9. The device of claim 6, wherein the layer of metal material is patterned to transmit signals at a frequency greater than 30 GHz.

10. The device of claim 6, wherein the substrate has a dielectric constant (Dk) less than 4 and a dissipation factor (Df) less than 0.003.

11. The device of claim 6, wherein the substrate further comprises a via and metal extending through the via.

12. The device of claim 6, wherein the substrate is at least 99.9999% $SiO_2$ by weight.

13. The device of claim 6, wherein the raised features comprise raised elongate features that have a length at least ten times a width thereof.

14. The device of claim 13, wherein the raised features are a crisscrossing.

15. The device of claim 13, wherein the substrate has asymmetry in flexibility.

16. The device of claim 13, wherein the raised and recessed features have a repeating profile shape in cross-section.

17. The device of claim 13, wherein at least some of the raised features extend from the first major surface of the substrate by a distance of at least 100 angstroms.

18. The device of claim 6, wherein the substrate further comprises:
a width and a length of the substrate that are each less than 100 m and greater than 1 mm;
an outer perimeter surface extending between the first major surface and the second major surface;
wherein at least some of the raised elongate features of the first group and of the second group extend from the surface a distance of at least 100 angstroms beyond a lowest portion of the first major surface; and
wherein the layer of metal extends across at least one raised elongate feature of the first group and across at least one raised elongate feature of the second group.

19. The device of claim 6, wherein the substrate bends to a radius of curvature of at least 500 mm without fracture when at room temperature of 25° C.

* * * * *